United States Patent
Tamada et al.

(10) Patent No.: US 11,874,358 B2
(45) Date of Patent: Jan. 16, 2024

(54) SYSTEM AND METHOD FOR DIFFUSION MAPPING USING PHASEMODULATED MAGNETIC RESONANCE IMAGING

(71) Applicant: WISCONSIN ALUMNI RESEARCH FOUNDATION, Madison, WI (US)

(72) Inventors: Daiki Tamada, Madison, WI (US); Scott B. Reeder, Middleton, WI (US)

(73) Assignee: WISCONSIN ALUMNI RESEARCH FOUNDATION, Madison, WI (US)

( * ) Notice: Subject to any disclaimer, the term of this patent is extended or adjusted under 35 U.S.C. 154(b) by 0 days.

(21) Appl. No.: 17/695,409

(22) Filed: Mar. 15, 2022

(65) Prior Publication Data

US 2023/0296710 A1    Sep. 21, 2023

(51) Int. Cl.
*G01R 33/561* (2006.01)
*G01R 33/56* (2006.01)

(52) U.S. Cl.
CPC ..... *G01R 33/5615* (2013.01); *G01R 33/5608* (2013.01)

(58) Field of Classification Search
CPC .......... G01R 33/5608; G01R 33/5615
See application file for complete search history.

(56) References Cited

U.S. PATENT DOCUMENTS 10,145,926 B2 * 12/2018 Bi ........................ A61B 5/7207
10,845,446 B2 11/2020 Reeder et al.
2019/0178966 A1 * 6/2019 Paul ................... G01R 33/5608
2020/0341090 A1 * 10/2020 Reeder ............ G01R 33/56341

OTHER PUBLICATIONS

Leroi et al., Simultaneous Multi-Parametric Mapping of Total Sodium Concentration, T1, T2 and ADC at 7T Using a Multi-Contrast Unbalanced SSFP, Magnetic Resonance Imaging, 2018, 53:156-163.
Sobol et al., On the Stationary States in Gradient Echo Imaging, Journal of Magnetic Resonance Imaging, 1996, 6(2):384-398.
Wang et al., Phase-Based T2 Mapping with Gradient Echo Imaging, Magnetic Resonance in Medicine, 2020, 84(2):609-619.

* cited by examiner

*Primary Examiner* — Gregory H Curran
(74) *Attorney, Agent, or Firm* — Quarles & Brady, LLP (57) ABSTRACT

A system and method are provided for controlling a magnetic resonance imaging (MRI) system. The method includes performing a gradient echo pulse sequence that includes a phase increment of an RF pulse of the gradient echo pulse sequence selected to encode diffusion information into a phase of MR signals. The method also includes controlling the plurality of gradient coils and the RF system to acquire the MR signals as MR data, processing the MR data to determine MR signals corresponding to diffusion in the subject when acquiring the MR signals, and generating at least one of an image or a map of the subject indicating the diffusion in the subject from the MR data.

23 Claims, 8 Drawing Sheets

SYSTEM AND METHOD FOR DIFFUSION MAPPING USING PHASEMODULATED MAGNETIC RESONANCE IMAGING

STATEMENT REGARDING FEDERALLY SPONSERED RESEARCH

This invention was made with government support under TR002373 awarded by the National Institutes of Health. The government has certain rights in the invention.

BACKGROUND

The field of the disclosure is systems and methods for magnetic resonance imaging (MRI). More particularly, the invention relates to systems and methods for magnetic resonance imaging to produce diffusion maps.

When a substance, such as human tissue, is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment, $M_{xy}$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well-known reconstruction techniques.

To do so, the signals are often weighted in different ways to give preference to or consider different sub-signals or so-called contrast mechanisms. Two basic "contrast mechanisms" commonly utilized in MR imaging are the spin-lattice (or longitudinal or T1) relaxation time or spin-spin (or transverse or T2) relaxation time. The T1 and T2 contrast mechanism are the two most important relaxation mechanisms commonly exploited to provide soft tissue contrast in clinical MRI examinations.

Diffusion-weighted MRI and quantitative diffusion imaging have also become indispensable tools for a plethora of research and clinical applications, such as the detection of acute stroke, detection of tumors. The majority of the conventional diffusion imaging utilizes echo planar imaging approach with very large motion probing gradient (MPG) pulses to encode diffusion-weighting into signal magnitude. That is, conventional diffusion MRI techniques rely on the use of diffusion encoding into the transverse magnetization using high amplitude diffusion gradients. As a result, there are many challenges to diffusion-weighted imaging in a clinical setting, such as limitation of spatial resolution, difficulty in three-dimensional (3D) imaging, eddy current, image distortion, ghosting, chemical shift artifacts related to incomplete fat suppression. Furthermore, diffusion-weighted and quantitative diffusion imaging are known to be particularly sensitive to motion, as they rely on small signals that must be acquired over substantial acquisition times.

Thus, there is a continuing need for new MRI data acquisition, data processing, and/or image reconstruction techniques, for acquiring data for and generating diffusion-weighted images and quantitative maps.

SUMMARY

The present disclosure overcomes the aforementioned drawbacks by providing systems and methods for diffusion-weighted imaging or mapping by encoding diffusion weighting into signal phase, instead of signal magnitude. In some configurations a RF phase-modulated gradient echo imaging may be used to encode diffusion weighting into the signal phase. In some non-limiting configurations, a multi-pass acquisition and/or dictionary-based reconstruction can be performed to estimate T2 and diffusion in a single imaging session. Thus, clinically-required diffusion information can be delivered with smaller gradient amplitudes compared to the conventional diffusion-weighted imaging.

In accordance with one aspect of the disclosure, a magnetic resonance imaging (MRI) system is provided that includes a magnet system configured to generate a static magnetic field ($B_0$) about at least a portion of a subject arranged in the MRI system, a plurality of gradient coils configured to apply magnetic gradients to the polarizing magnetic field, and a radio frequency (RF) system configured to apply an excitation field to the subject and acquire MR image data from the subject. The system also includes a computer system that is programmed to control the plurality of gradient coils and the RF system to perform a gradient echo pulse sequence that includes a phase increment of an RF pulse of the gradient echo pulse sequence selected to encode diffusion information into a phase of MR signals and control the plurality of gradient coils and the RF system to acquire the MR signals as MR data. The computer system is further programmed to process the MR data to determine MR signals corresponding to diffusion in the subject when acquiring the MR signals and generate at least one of an image or a map of the subject indicating the diffusion in the subject from the MR data.

In accordance with another aspect of the disclosure, a method is provided for controlling a magnetic resonance imaging (MRI) system. The method includes performing a gradient echo pulse sequence that includes a phase increment of an RF pulse of the gradient echo pulse sequence selected to encode diffusion information into a phase of MR signals. The method also includes controlling the plurality of gradient coils and the RF system to acquire the MR signals as MR data, processing the MR data to determine MR signals corresponding to diffusion in the subject when acquiring the MR signals, and generating at least one of an image or a map of the subject indicating the diffusion in the subject from the MR data.

The foregoing and other aspects and advantages of the invention will appear from the following description. In the description, reference is made to the accompanying drawings, which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Recently, a phase-based T2 mapping method that encodes T2 information into phase of RF phase modulated gradient echo signal has been proposed and demonstrated (Wang X, Hernando D, Reeder S B. Phase-based T2 mapping with gradient echo imaging. Magnetic Resonance in Medicine 2019 and U.S. Pat. No. 10,845,446, both of which are incorporated herein by reference). Wang et al. investigated the use of RF-modulated gradient echo (GRE) MRI for a phase-based T2 mapping approach. With GRE methods, the repeated application of imaging and spoiling gradients can lead to significant encoding of diffusion-weighted information into the coherent transverse magnetization, leading to significant diffusion weighting in the GRE signal. The present disclosure provides a phase-based diffusion mapping (PBD) by encoding diffusion weighting into the phase of RF-phase modulated GRE signal, providing a novel method to acquire diffusion data and determine important clinical metrics, such as, for example, measuring the apparent diffusion coefficient (ADC) of tissue.

The steady-state solution for GRE imaging in the presence of isotropic diffusion can be derived. The complex magnetization vector x after the nth RF pulse is defined as:

$$|x_n\rangle = \begin{bmatrix} F_n \\ F_n^* \\ H_n \end{bmatrix},$$

Eqn. (1);

where F, and H transverse and longitudinal magnetization, and * denotes the conjugate complex. Assuming a train of RF pulses with transmit phase modulation, the magnetization can be expressed using a Fourier expansion given by:

$$F_n = \Sigma_{l=-\infty}^{\infty} f_l(n) e^{j\theta_l(n)} e^{jl\varphi},$$

Eqn. (2);

$$H_n = \Sigma_{l=-\infty}^{\infty} h_l(n) e^{j\vartheta_l(n)} e^{jl\varphi},$$

Eqn. (3);

where $f_l$ and $h_l$ are the transverse and longitudinal components of $l^{th}$ order of configuration, $\theta_l$ and $\vartheta_l$ are the phase which is introduced to separate the phase and magnitude components of $l^{th}$ configuration after $n^{th}$ RF pulse. The configuration is a substate with a certain de-phasing state that compose the magnetization. An echo from the configuration with l=0 is called a free induction decay (FID)-echo, whereas that with l=−1 is known as a spin-echo or steady-state free precession (SSFP)-echo in GRE sequences. Because longitudinal magnetization is a real value, the following condition must be satisfied:

$$\vartheta_{-l}(n) = -\vartheta_l(n),$$

$$h_{-l}(n) = h^*_l(n),$$

Eqn. (4).

The relationship of transverse magnetization between two consecutive configurations is obtained by solving linear equations. To derive the steady-state of the RF-modulated GRE signal, consider the complex status of the configurations $f_l$ after applying consecutive RF pulses. When the RF pulse with a flip angle of $\alpha$, and transmission phase of $\phi_T$ is used, the relationship of the magnetization between before and after excitation can be expressed as:

$$|x_n\rangle^+ = \begin{bmatrix} \cos^2\frac{\alpha}{2} & \sin\frac{\alpha}{2} \cdot e^{2j\phi_T(n)} & -t \cdot \sin^2\alpha \cdot e^{j\phi_T(n)} \\ \sin^2\frac{\alpha}{2} \cdot e^{-2j\phi_T(n)} & \cos^2\frac{\alpha}{2} & j \cdot \sin\alpha \cdot e^{-j\phi_T(n)} \\ -\frac{j}{2}\sin\alpha \cdot e^{-j\phi_T(n)} & \frac{j}{2}\sin\alpha \cdot e^{j\phi_T(n)} & \cos\alpha \end{bmatrix} |x_n\rangle^-,$$

Eqn. (5);

where the superscripts "−" and "+" denote magnetization before and after excitation. The relationship of configurations is obtained as below using Eqns. 2, 3 and (5).

$$\begin{bmatrix} f_l(n) \\ f^*_{-l}(n) \\ h_l(n) \end{bmatrix}^+ =$$

Eqn. (6);

$$\begin{bmatrix} \cos^2\frac{\alpha}{2} & \sin\frac{\alpha}{2} \cdot e^{j(\psi_{13}-\psi_{23})} & -t \cdot \sin^2\alpha \cdot e^{j\psi_{13}} \\ \sin^2\frac{\alpha}{2} \cdot e^{-j(\psi_{13}-\psi_{23})} & \cos^2\frac{\alpha}{2} & j \cdot \sin\alpha \cdot e^{j\psi_{23}} \\ -\frac{j}{2}\sin\alpha \cdot e^{-j\phi_T(n)} & \frac{j}{2}\sin\alpha \cdot e^{j\phi_T(n)} & \cos\alpha \end{bmatrix} \begin{bmatrix} f_l(n) \\ f^*_{-l}(n) \\ h_l(n) \end{bmatrix}^-,$$

where:

$$\psi_{13}(n,l) = \phi_T(n) + \vartheta_l(n) - \theta_l(n)$$

$$\psi_{23}(n,l) = -\phi_T(n) + \vartheta_l(n) + \theta_{-l}(n)$$

Eqn. (7).

To include the effects of transverse and longitudinal relaxation after the excitation pulse, transverse X and longitudinal Y relaxation operators are introduced as follows:

$$|x_{n+1}\rangle^{-} = \begin{bmatrix} X(l)e^{j\phi} & 0 & 0 \\ 0 & X(l)e^{-j\phi} & 0 \\ 0 & 0 & Y(l) \end{bmatrix} |x_n\rangle^{+} + (1-Y(l))M_0\delta_{l,0}\begin{bmatrix} 0 \\ 0 \\ 1 \end{bmatrix}, \quad \text{Eqn. (8);}$$

where $\delta_{l,0}$ is Kronecker's delta. The relaxation operator include T1, T2, and diffusion relaxation terms, is described by:

$$X(l) = e^{-\frac{t}{T2}} \cdot e^{-D\gamma^2 G^2 t^3 \left(l^2+l+\frac{1}{3}\right)}$$
$$Y(l) = e^{-\frac{t}{T1}} \cdot e^{-D\gamma^2 G^2 t^3 l^2} \quad \text{Eqn. (9);}$$

where T1 and T2 are spin-lattice and spin-spin relaxation time and D denotes diffusion coefficient (assume isotropic and Gaussian), $\gamma$ is the gyromagnetic ratio, G is the applied gradient field, t is the duration of the gradient field. From Eqn. 8, the relationship between expansion coefficients of transverse magnetization can be obtained as:

$$\Sigma_{l=-\infty}^{\infty} f_l(n)e^{j\theta_l(n)}e^{jl\phi} = \Sigma_{l=-\infty}^{\infty} X(l)f_l(n-1)e^{j\theta_l(n-1)}e^{j(l+1)\phi}, \quad \text{Eqn. (10);}$$

$$\Sigma_{l=-\infty}^{\infty} f^*_{-l}(n)e^{j\theta_l(n)}e^{jl\phi} = \Sigma_{l=-\infty}^{\infty} X(-l)f^*_{-l}(n-1)e^{j\theta_{-l}(n-1)}e^{j(-l+1)\phi}, \quad \text{Eqn. (11).}$$

Here, letting 1→l−1, and 1→l+1 for the right side of Eq. A.6 and A.7 to maintain the relationship of the expansion. Then, the relationship between after excitation and before next excitation becomes:

$$\begin{bmatrix} f_l(n) \\ f^*_{-l}(n) \\ h_l(n) \end{bmatrix}^{-} = \begin{bmatrix} X(l-1)e^{j(\theta_{l-1}(n-1)-\theta_l(n))} & 0 & 0 \\ 0 & X(-l-1)e^{j(\theta_{l-1}(n-1)-\theta_l(n))} & 0 \\ 0 & 0 & Y(l)e^{j(\vartheta_l(n-1)-\vartheta_l(n))} \end{bmatrix} \quad \text{Eqn. (12).}$$

$$\begin{bmatrix} f_{l-1}(n-1) \\ f^*_{-l-1}(n-1) \\ h_l(n-1) \end{bmatrix}^{+} + (1-Y(0))M_0\delta_{l,0}\begin{bmatrix} 0 \\ 0 \\ 1 \end{bmatrix},$$

In the steady-state, the relaxation operator should not depend on n. To satisfy this condition, the following relationship can be enforced:

$$\theta_l(n) = \hat{\theta}(n-l) + n\tilde{\theta}$$
$$\vartheta_l(n) = \hat{\vartheta}(l) + n\tilde{\vartheta}(l)$$
$$\phi_T(n) = A + Bn + Cn^2 \quad \text{Eqn. (13).}$$

Therefore, the evolution matrix to explain consecutive RF pulses can be expressed using Eqns. 6, 12, and 13 as:

$$\begin{bmatrix} f_l(n) \\ f^*_{-l}(n) \\ h_l(n) \end{bmatrix}^{+} = \begin{bmatrix} X(l-1)\cos^2\frac{\alpha}{2} & X(-l-1)\sin^2\frac{\alpha}{2}\cdot e^{2jCl^2} & -t\cdot Y(l)\cdot\sin^2\alpha\cdot e^{jCl^2+2jCl} \\ X(l-1)\sin^2\frac{\alpha}{2}\cdot e^{-2jCl^2} & X(-l-1)\cos^2\frac{\alpha}{2} & j\cdot Y(l)\cdot\sin\alpha\cdot e^{jCl^2+2jCl} \\ -X(l-1)\frac{j}{2}\sin\alpha\cdot e^{jCl^2} & X(-l-1)\frac{j}{2}\sin\alpha\cdot e^{-jCl^2} & Y(l)\cos\alpha\cdot e^{2jCl} \end{bmatrix} \quad \text{Eqn. (14).}$$

$$\begin{bmatrix} f_{l-1}(n-1) \\ f^*_{-l-1}(n-1) \\ h_l(n-1) \end{bmatrix}^{+} + (1-Y(0))M_0\delta_{l,0}\begin{bmatrix} 0 \\ 0 \\ 1 \end{bmatrix}$$

In Eqn. 14, the evolution matrix does not depend on A, and B, which is $0^{th}$ and $1^{st}$ order of magnetic field, such as field inhomogeneity and drift.

In case of l=0, the following equation can be derived as:

$$f_0 = \frac{1}{1 - Y(0)\cos\alpha}\left[X(-1)\cdot(1 - Y(0)\cos\alpha)\frac{f_{-1} + f_{-1}^*}{2} + X(-1)\cdot(\cos\alpha - Y(0))\frac{f_{-1} - f_{-1}^*}{2} - j(1 - Y(0))M_0\sin\alpha\right]$$

Eqn. (15);

where X(l), and Y(l) is the transverse and longitudinal relaxation term at the $l^{th}$ configuration defined in Eqn. 9, and α the flip angle.

In the case of l≠0, the below matrix form representation is derived.

$$\begin{bmatrix}f_l \\ f_{-(l+1)}^*\end{bmatrix} = \Omega_l \begin{bmatrix}f_{l-1} \\ f_{-l}^*\end{bmatrix},$$

Eqn. (16);

where:

$$\Omega_l = \frac{1}{X(-l-1)\cdot\left(-1 + Y(l)e^{2jCl}\right)} \cdot$$

$$\begin{bmatrix} X(l-1)\cdot X(-l-1)\cdot\left(Y(l)e^{2jCl} - \cos\alpha\right)\cdot\sec^2\frac{\alpha}{2} & -X(-l-1)\cdot\left(1 + Y(l)e^{2jCl}\right)\cdot e^{-2jCl^2}\cdot\tan^2\frac{\alpha}{2} \\ X(l-1)\cdot\left(1 + Y(l)e^{2jCl}\right)\cdot e^{2jCl^2}\cdot\tan^2\frac{\alpha}{2} & \left(-1 + Y(l)e^{2jCl}\cos\alpha\right)\cdot\sec^2\frac{\alpha}{2} \end{bmatrix}$$

Eqn. (17);

where $$C = \frac{\theta}{2}$$

and is the coefficient for the quadratic RF phase increment and θ is the RF phase increment. This equation represents an arbitrary $l^{th}$ configuration that can be derived recursively as follows:

$$\begin{bmatrix}f_l \\ f_{-(l+1)}^*\end{bmatrix} = \Omega_l \ldots \Omega_3\Omega_2\Omega_1\begin{bmatrix}f_{-1} \\ f_0^*\end{bmatrix}.$$

Eqn. (18)

Assuming l→∞, the configuration of $f_{l\to\infty}$ should be converge to zero because of diffusion relaxation. Therefore, the following equation is obtained as:

$$\lim_{l\to\infty}\Omega_l \ldots \Omega_3\Omega_2\Omega_1\begin{bmatrix}f_{-1} \\ f_0^*\end{bmatrix} = \Omega_\infty\begin{bmatrix}f_{-1} \\ f_0^*\end{bmatrix} = |0\rangle,$$

Eqn. (19);

where $\Omega_\infty$ is the matrix obtained recursively defined as:

$$\Omega_\infty = \begin{bmatrix}\Omega_{11} & \Omega_{12} \\ \Omega_{21} & \Omega_{22}\end{bmatrix}.$$

Eqn. (20)

From Eqn. 29 the following condition must be satisfied:

$$f_0 = -\frac{\Omega_{12}}{\Omega_{11}}f_{-1}^*;$$

Eqn. (21)

$$f_0 = -\frac{\Omega_{22}}{\Omega_{21}}f_{-1}^*.$$

Eqn. (22)

Finally, the $0^{th}$ and $-1^{st}$ configurations are derived by inserting Eqn. 32 into Eqn. 25, such that:

$$f_0 = \beta(\eta X(-1) + j(\eta^2 - \epsilon(X(-1) - \epsilon))),$$

Eqn. (23);

$$f_{-1} = \beta(\eta + j(X(-1) - \epsilon)),$$

Eqn. (24);

where $$\epsilon + j\eta = -\frac{\Omega_{22}}{\Omega_{21}},$$

Eqn. (25);

$$\beta = \frac{(1 - Y(0))M_0\sin\alpha}{(X(-1) - \epsilon)[X(-1)(\cos\alpha - Y(0)) + \epsilon(1 - Y(0)\cos\alpha)] - \eta^2(1 - Y(0)\cos\alpha)},$$

Eqn. (26).

Using the expressions derived in these equations, the analytical characteristics of GRE can be explained. This allows the prediction of the steady-state magnitude and phase of the RF phase-modulated GRE signal in the steady-state, given a particular set of relaxation (T1, T2) and diffusion (D) conditions, for a given RF phase modulation, flip angle and TR.

The signal evolution of SGRE can be derived using the Bloch equation with diffusion term. The magnetization m of a isochromat at the ith position after the nth RF pulse is defined as:

$$|m_{n,i}\rangle = \begin{bmatrix} m_x(n,i) \\ m_y(n,i) \\ m_z(n,i) \end{bmatrix};$$ Eqn. (27)

where $m_x$, $m_y$, and $m_z$ are the magnetization of x, y, and y components, respectively. The relationship between the n and n+1th magnetizations was obtained in the below matrix-form equation.

$$|m_{n+1,l}\rangle = \sum_{q=l-N_{max}}^{l+N_{max}} P(l,q) \cdot E(l,q)|m_{n,q}\rangle + \left(1 - e^{-\frac{TR}{T_1}}\right)|m_0\rangle;$$ Eqn. (28)

where P is Gaussian probability function which includes diffusion propagation, E is the relaxation operator that includes T1, T2, and diffusion relaxation terms, $N_{max}$ is the range for the summation, and $m_0$ is the equilibrium magnetization. The function P, which is reflecting the assumption that diffusion behaves in a Gaussian manner, is expressed by:

$$P(l,q) = \frac{2\pi}{\gamma GtN\sqrt{4\pi DTR}} e^{-\frac{(\psi_l - \psi_q)^2}{4DTR\gamma^2 t^2 G^2}},$$ Eqn. (29)

where N denotes the number of spin isochromats, TR is the repetition time, and the $\psi_l$ and $\psi_q$ are the phase of $l^{th}$ and $q^{th}$ isochromats as:

$$\psi_l = x(l)\gamma Gt$$

$$\psi_q = x(q)\gamma GT$$ Eqn. (30).

The relaxation operator E is expressed as:

$$E(l,q) = \begin{bmatrix} E_D e^{-\frac{TR}{T_2}}\cos\left(\frac{\psi_l - \psi_q}{2}\right) & E_D e^{-\frac{TR}{T_2}}\sin\left(\frac{\psi_l - \psi_q}{2}\right) & 0 \\ E_D e^{-\frac{TR}{T_2}}\sin\left(\frac{\psi_l - \psi_q}{2}\right) & E_D e^{-\frac{TR}{T_2}}\cos\left(\frac{\psi_l - \psi_q}{2}\right) & 0 \\ 0 & 0 & e^{-\frac{TR}{T_1}} \end{bmatrix},$$ Eqn. (31);

where:

$$E_D = e^{-\frac{\gamma^2 t^3 G^2 D}{12}}.$$ Eqn. (32)

The Bloch equation with the random walk model, described in this section, enables the calculation of the magnetization of RF modulated GRE. The signal evolution toward the steady-state can be derived by applying the Eq. 28 iteratively.

Figure 1:
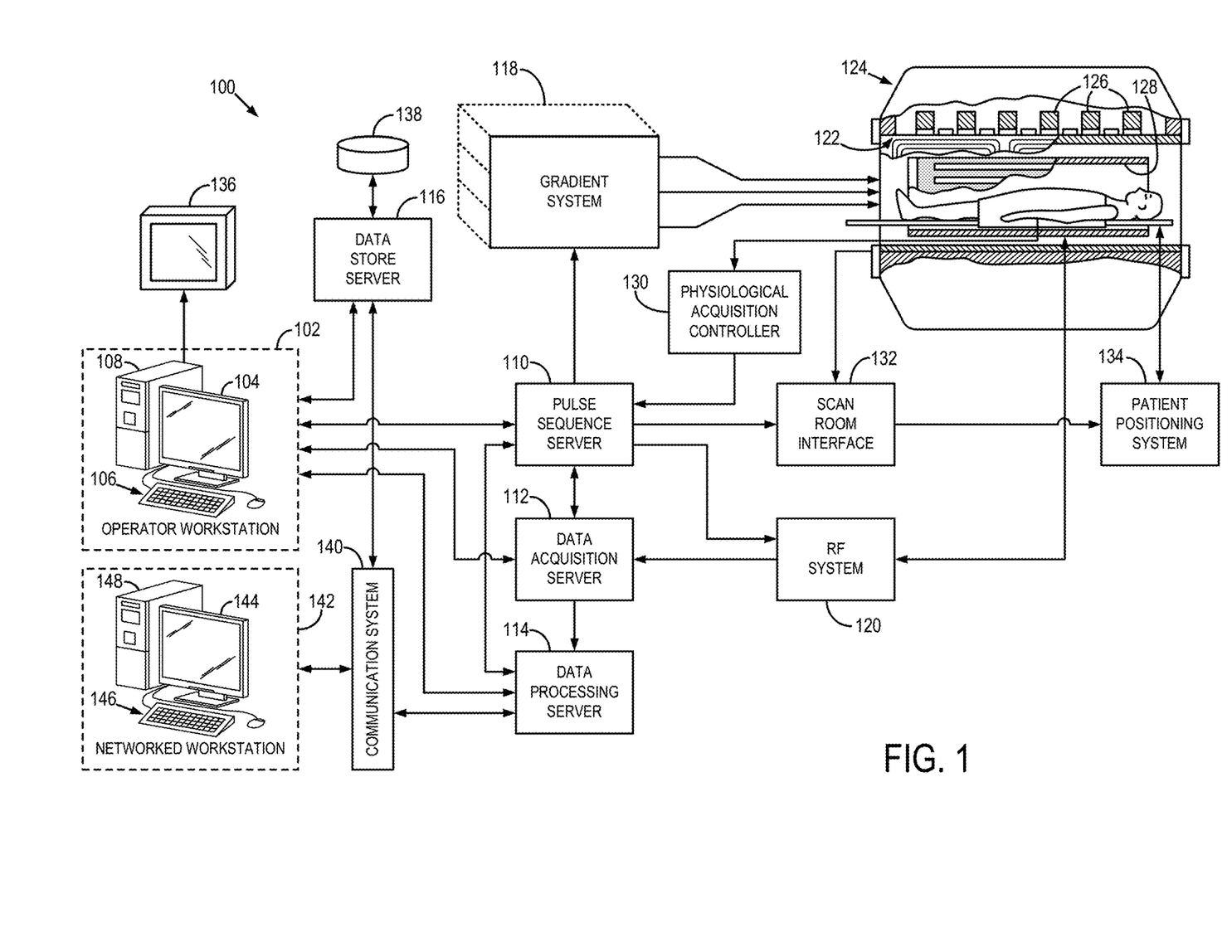
FIG. 1 is a block diagram of an exemplary magnetic resonance imaging (MRI) system configured in accordance with the present disclosure.

This theoretical basis for gradient-based imaging provides a basis to understand the systems and methods provided herein, as will be explained. Referring now to FIG. 1, a magnetic resonance imaging (MRI) system 100 is provided that may be configured, programmed, or otherwise utilized in accordance with the present disclosure. The MRI system 100 includes an operator workstation 102, which will typically include a display 104, one or more input devices 106 (such as a keyboard and mouse or the like), and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to multiple servers, including a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 140, which may include any suitable network connection, whether wired, wireless, or a combination of both. As an example, the communication system 140 may include both proprietary or dedicated networks, as well as open networks, such as the internet.

The pulse sequence server 110 functions in response to instructions downloaded from the operator workstation 102 to operate a gradient system 118 and a radiofrequency (RF) system 120. Gradient waveforms to perform the prescribed scan are produced and applied to the gradient system 118, which excites gradient coils in an assembly 122 to produce the magnetic field gradients $G_x$, $G_y$, $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil, are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M\sqrt{I^2 + Q^2}$$ Eqn. (33);

and the phase of the received magnetic resonance signal may also be determined according to the following relationship:

$$\varphi = \tan^{-1}\left(\frac{Q}{I}\right).$$ Eqn. (34)

The pulse sequence server 110 also optionally receives patient data from a physiological acquisition controller 130. By way of example, the physiological acquisition controller 130 may receive signals from a number of different sensors connected to the patient, such as electrocardiograph (ECG) signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data are lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data are acquired and used to calibrate the pulse sequence performed by the pulse sequence server 10. As another example, navigator signals may be acquired and used to adjust the operating parameters of the RF system 120 or the gradient system 118, or to control the view order in which k-space is sampled.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction techniques, such as iterative or backprojection reconstruction techniques; applying filters to raw k-space data or to reconstructed images; generating functional magnetic resonance images; calculating motion or flow images; and so on.

Images reconstructed by the data processing server 114 are conveyed back to the operator workstation 102. Images may be output to operator display 112 or a display 136 that is located near the magnet assembly 124 for use by attending clinician. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144, one or more input devices 146 (such as a keyboard and mouse or the like), and a processor 148. The networked workstation 142 may be located within the same facility as the operator workstation 102, or in a different facility, such as a different healthcare institution or clinic. The networked workstation 142 may include a mobile device, including phones or tablets.

The networked workstation 142, whether within the same facility or in a different facility as the operator workstation 102, may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be processed remotely by a networked workstation 142. This data may be exchanged in any suitable format, such as in accordance with the transmission control protocol (TCP), the internet protocol (IP), or other known or suitable protocols.

Figure 2:
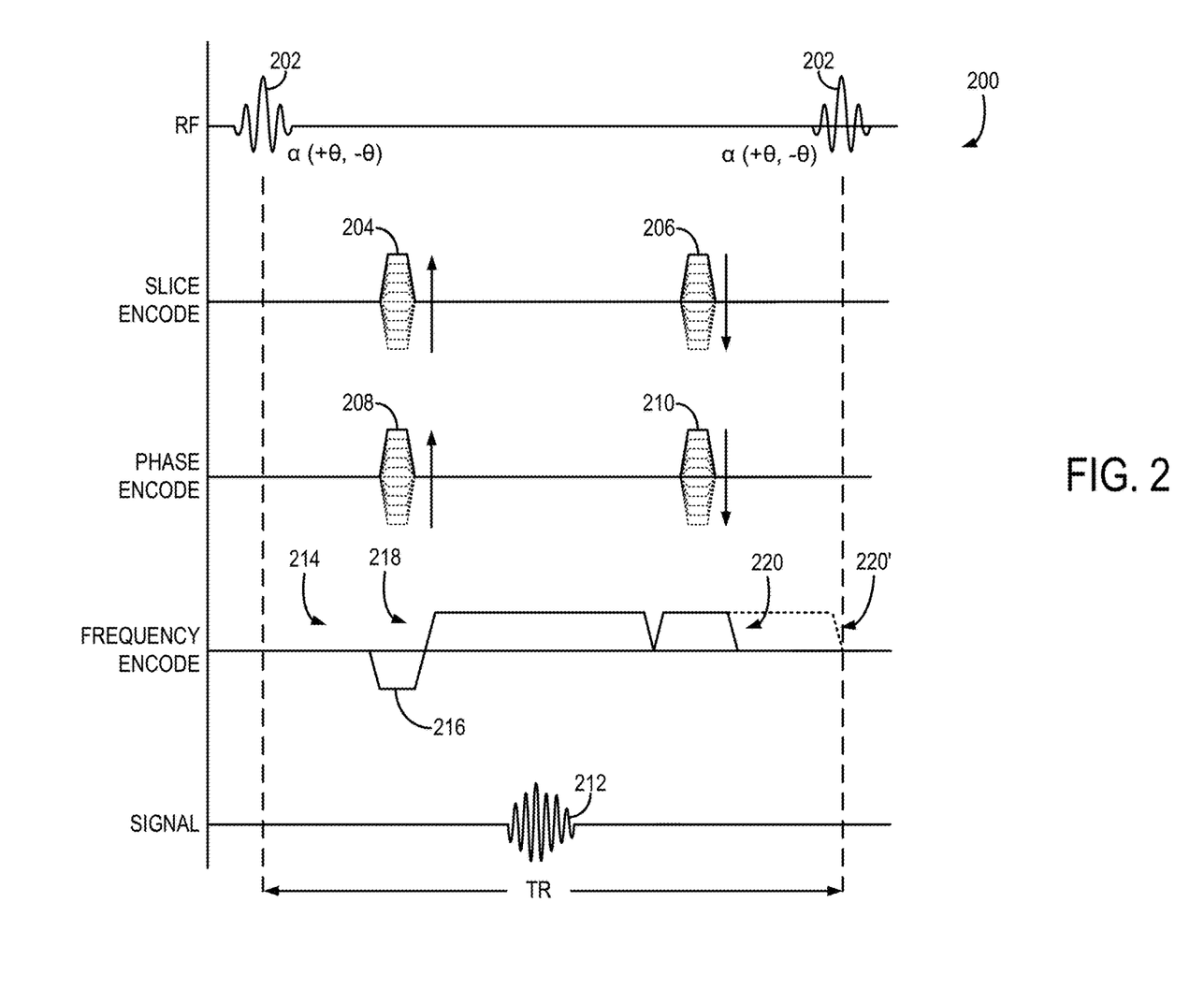
FIG. 2 is a graphic representation of an exemplary pulse sequence for directing the MRI system of FIG. 1 in accordance with aspects of the present disclosure related to by encoding diffusion weighting into signal phase.

The above-described MRI system can be used to implement a variety of pulse sequences to effectuate desired imaging studies. Furthermore, the systems and/or computers or processors described above can be programmed to carry out image or map reconstructions and/or derive a variety of clinically-desired metrics or measures. One category of pulse sequence is the gradient echo (GRE) sequence and variations thereof, such as spoiled gradient echo (SGRE) acquisitions. Referring to FIG. 2, one non-limiting example of a pulse sequence 200 in accordance with the present disclosure is provided. In particular, the pulse sequence 200 of FIG. 2 is a GRE pulse sequence designed in accordance with the present disclosure.

In particular, the pulse sequence 200 includes radio frequency (RF) pulses 202 that includes a phase increment. For example, as will be described, the RF excitation pulse 202 may be performed with quadratic phase modulation of $\theta$ and may have the polarity selected to vary between passes or repetitions of the pulse sequence 200. Slice and phase encoding may be achieved using respective slice-selective gradients 204, 206 and phase-encoding gradients 208, 210. In particular, following excitation of the nuclear spins in the imaging slice prescribed by the slice encoding gradients 204, 206, a phase encoding gradients 208, 210 are applied to spatially encode the elicited echoes 212. A series of readout gradients 214 are also applied starting with a dephasing gradient lobe 216 followed by the readout encoding 218 to spatially encode the echo 212 along a second, orthogonal direction in the prescribed imaging slice. Finally, a spoiler gradient 220 is applied.

As will be described, on selected passes or repetitions of the pulse sequence 200, the pulses may be varied. That is, beyond the phase increments described above, an amplitude of the gradients may be modulated.

GRE signal phase increases monotonically with diffusion coefficient when the RF-modulated GRE is acquired with motion probing gradient (MPG) pulses. Signal phase with a larger MPG pulse (e.g., 7.8 mT/s for 7 ms) shows a strong monotonic decrease of signal phase with diffusion coefficient, compared to smaller MPG pulses. Such a MPG pulse is far smaller than gradient pulses used in conventional diffusion MRI for diffusion encoding. In particular, such MPG pulse amplitude and duration is 5-20 times lower than conventional gradient pulses used for diffusion encoding.

The signal phase is independent of T1 over a wide range of typical in vivo T1 values. Since the phase of the GRE signal also depends on T2, simultaneous estimation of T2 and diffusion can be achieved by measuring the signal phase associated with large and small MPG pulses, as part of an RF phase modulated acquisition.

Thus, by varying MPG magnitude, the phase of RF phase modulated GRE signal is sensitized to diffusion. Furthermore, the above-described process has the added benefit of allowing simultaneous T2 mapping.

The spoiler gradient may be extended 220' to create a larger spoiler moment. In just one non-limiting example, a first and second pass may include the initial spoiler gradient 220 and the third and fourth passes may include the extended spoiler gradient 220'. Notably, however, the systems and methods provided herein do not require four passes, but can be realized with, for example, three passes, or can use additional passes.

To understand the design of the pulse sequence 200 and how to utilize the pulse sequence in accordance with the systems and methods described herein, the signal MR 212 elicited in accordance with the present disclosure may be considered. A closed form signal equation for the RF phase-modulated GRE pulse sequence of FIG. 2 may be considered. As noted above, the pulse sequence includes modulation of a phase of the RF pulse 202 by incrementing the transmit RF phase ($\phi$) quadratically. For example, the transmit RF phase ($\phi$) may be incremented quadratically such that $\phi(n)=\phi(n-1)+n\theta$, where $\theta$ is the RF phase increment. The signal 212 elicited with the RF pulse with flip angle (FA) of $\alpha$, RF phase of $\phi$, and a repetition time (TR) can be expressed as:

$$\text{Re}(S) = \beta \eta e^{-\frac{TR}{T2}}; \quad \text{Eqn. (35)}$$

$$\text{Im}(S) = \beta \left[ \eta^2 - \epsilon \left( e^{-\frac{TR}{T2}} - \epsilon \right) \right]; \quad \text{Eqn. (36)}$$

with $$\beta = \frac{(1 - Y(0))M_0 \sin\alpha}{(X(-1) - \epsilon)[X(-1)\cos\alpha - Y(0)) + \epsilon(1 - Y(0)\cos\alpha)] - \eta^2(1 - Y(0)\cos\alpha)}; \quad \text{Eqn. (37)}$$

where $M_0$ is the proton density, and $\epsilon$ and $\eta$ are real coefficients determined by recursive calculation depending on T1, T2, TR, $\alpha$, and $\theta$, X and Y are the T2 and T1 relaxation factors, include the diffusion term defined as:

$$X(l) = e^{-\frac{t}{T2}} \cdot e^{-D\gamma^2 G^2 t^3 \left( l^2 + l + \frac{1}{3} \right)}; \quad \text{Eqn. (38)}$$

$$Y(l) = e^{-\frac{t}{T1}} \cdot e^{-D\gamma^2 G^2 t^3 l^2}; \quad \text{Eqn. (39)}$$

where t is the gradient pulse duration, D is diffusion coefficient, $\gamma$ is the gyromagnetic ratio, l is the configuration, as explained in Sobol W T, Gauntt D M. On the stationary states in gradient echo imaging. Journal of Magnetic Resonance Imaging 1996;6(2):384-398, which is incorporated herein by reference. Equations (35) and (36) suggest that diffusion can be encoded into GRE signal phase as well as T2.

Figure 3:
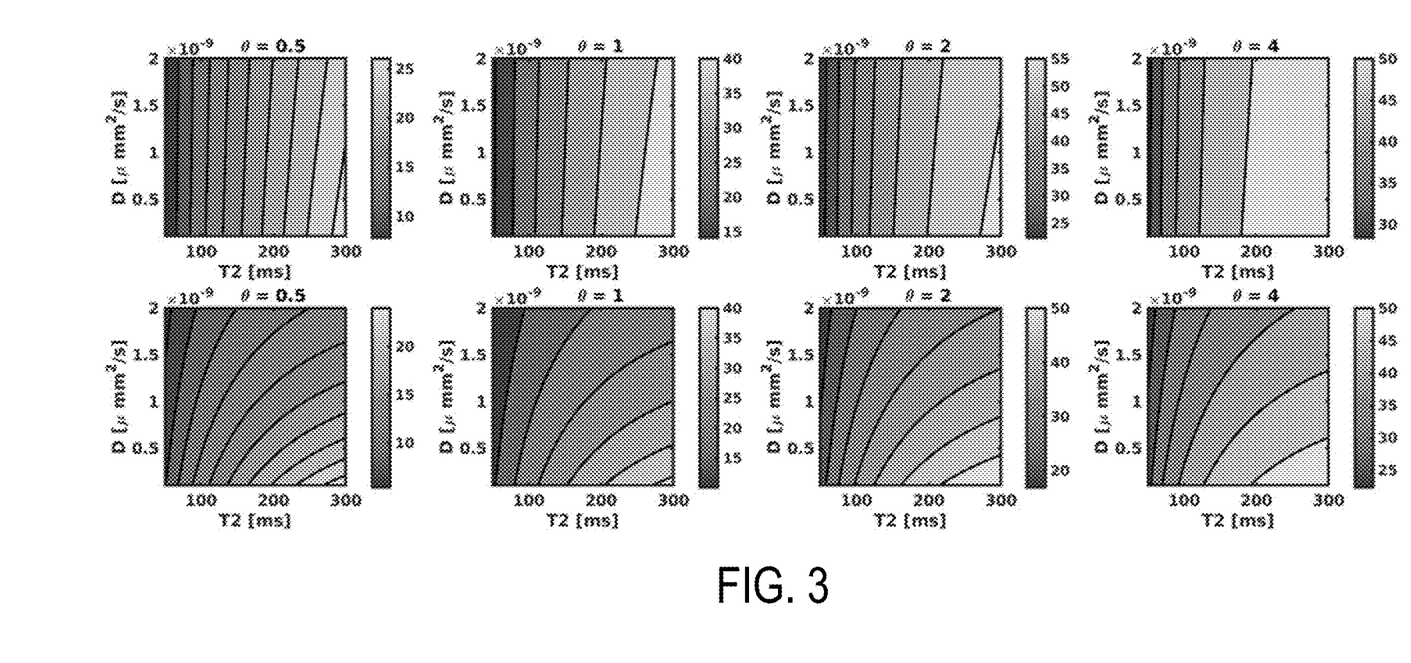
FIG. 3 is a set of graphs of signal phase calculated using the models provided herein, as a function of T2 and diffusion with varying RF phase increments.

Referring to FIG. 3, a set of plots of signal phase are provided that were calculated using the above equations, as a function of T2 and diffusion with varying RF phase increments. The signal phase with gradient moment of $2\pi$ highly depends on T2. On the other hands, gradient moment of $8\pi$ provides diffusion weighting to signal phase in case of small RF phase increments. T1 and T2 of 1000 and 100 ms are assumed in this simulation. Thus, with small $\theta$, the signal phase with $8\pi$ gradient moment is sensitive to diffusion coefficient, while the phase highly depends on T2 in case of $2\pi$ moment.

Figure 4:
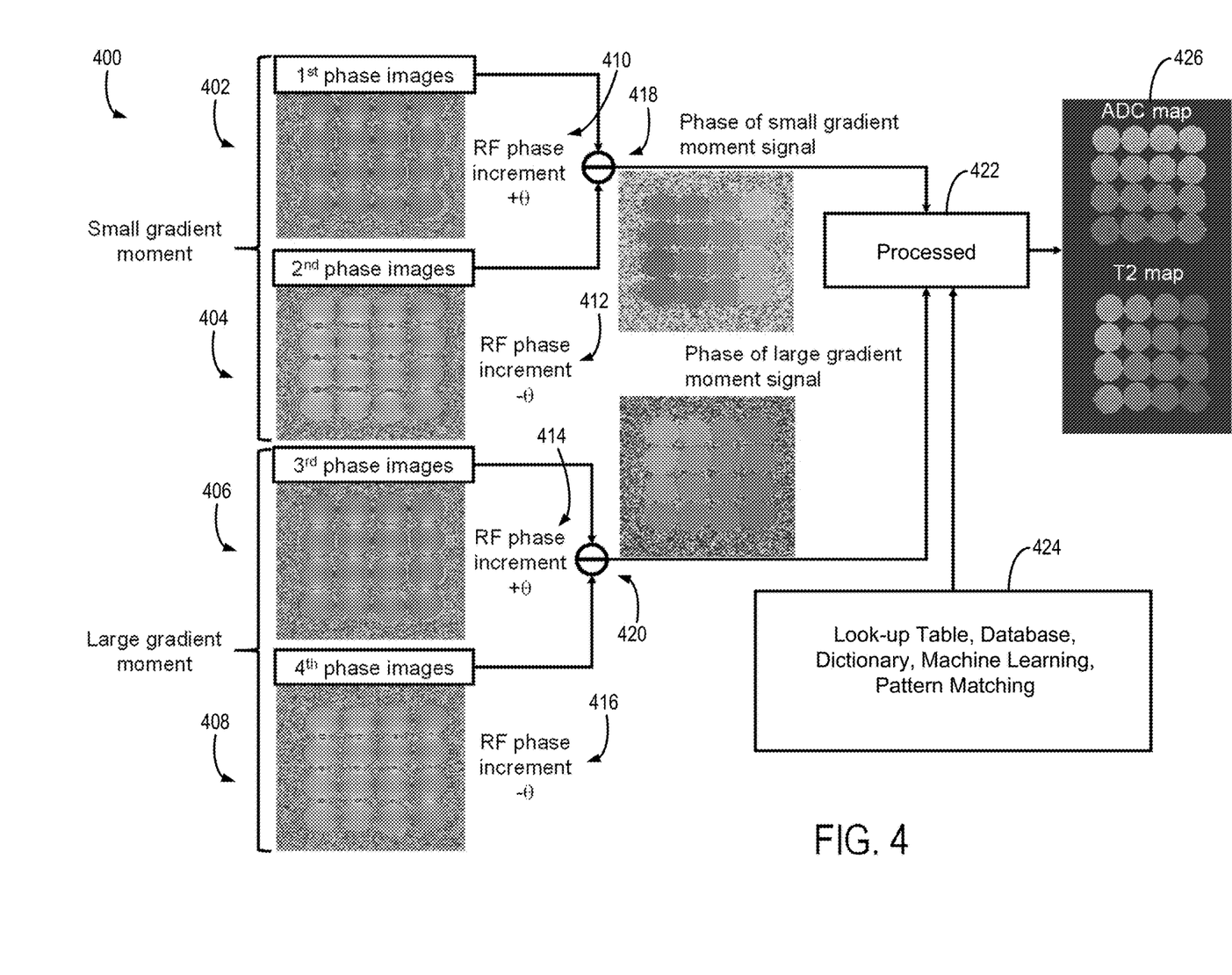
FIG. 4 is a flow chart for an image reconstruction process in accordance with one aspect of the present disclosure.

In accordance with one, non-limiting example of the present disclosure, a multi-pass acquisition may be performed using the pulse sequence 200 of FIG. 2 to acquire MR diffusion mapping data. Referring to FIG. 4, one non-limiting example, of a process in accordance with the present disclosure is provided. In the non-limiting example illustrated in FIG. 4, a four-pass acquisition and reconstruction 400 may be performed. The first two passes 402, 404 may use a small gradient moment. In one non-limiting example, a small gradient moment may include $2\pi$. The next two passes 406, 408 may use a larger moment can be used for the last two passes to encode T2 and diffusion information. In accordance with one, non-limiting example, a larger moment may include $8\pi$. Opposite polarity of RF phase increments 410, 412, 414, 416 of $\pm\theta$ may be used in each set of two passes. In doing so, the phase can be obtained by subtracting between the two passes 418, 420. Then, the subtracted signals can be processed 422 to create T2 and ADC maps or images, or other images. In one non-limiting example, the processing 422 utilize a look-up table, database, dictionary, pattern matching or other matching process, or can use machine learning or the like 424. For example, the look-up table, database, dictionary, pattern matching or other matching process, or machine learning or the like 424 can be created or trained using equations (35) and (36).

Thus, in one example, the phase of the signal with small gradient moment can be calculated by subtracting between the first- and second-pass image phases. The phase for large gradient moment, which has diffusion weighting, can be obtained by subtracting between the third- and fourth-pass image phases. ADC and T2 maps 426 can be derived simultaneously using the derived phases and calculated using the equations and/or matching and/or machine learning described above.

NON-LIMITING EXAMPLE

To test the above-described process, Bloch equation simulations were performed with diffusion term to validate the closed form for the GRE signal introduced in the study. The simulation was implemented using the following parameters: TR=10 ms, TE=1 ms, FA=20 degrees, $\theta=+/-2$ degrees, gradient moment=93.3 Gauss/m, ADC=1000-6000 μmm2/s. T1 and T2 of 1000 and 100 ms were used.

Also, phantom experiments were performed to provide preliminary evaluation of the PBD approach provided herein to measure diffusion and T2. The phantom included 16 vials having different amounts of PVP (10-50%) and MnCl2 (0.01-0.08 mM). The acquisition was performed on a clinical 3-tesla MRI system (GE Healthcare, Waukesha, WI) with a 48-channel head coil using spin-echo (SE) and PROPOLLER SE diffusion-weighted imaging. The acquisition parameters were:

|  | Phantom | | Volunteer | |
| --- | --- | --- | --- | --- |
|  | PROPELLER | | | |
| Parameters | Diffusion-SE | PBD | SE-DWI | PBD |
| TR | 857 ms | 9.1 ms | 2225 ms | 9.1 ms |
| (Effective) TE | 14 ms | 3.5 ms | 57.1 ms | 3.5 ms |
| Flip Angle | 90° | 20° | 90° | 20° |

| | Phantom | | | |
|---|---|---|---|---|
| | PROPELLER | | Volunteer | |
| Parameters | Diffusion-SE | PBD | SE-DWI | PBD |
| FOV | 20 × 20 cm² | 20 × 20 × 9.6 cm³ | 20 × 20 cm² | 20 × 20 × 12.8 cm³ |
| Matrix Size | 300 × 224 | 160 × 160 × 32 | 116 × 116 | 160 × 160 × 32 |
| Number of Slices | 28 | NA | 20 | NA |
| Slice Thickness | 3 mm | 3 mm | 5 mm | 4 mm |
| Bandwidth | 488 Hz/Px | 488 Hz/Px | 1953 Hz/Px | 488 Hz/Px |
| b value | 1000 s/mm² | NA | 1000 s/mm² | NA |
| Gradient Amplitude | NA | 23.3/93.3 Gauss/m | NA | 23.3/93.3 Gauss/m |
| RF phase increment | NA | +2°/−2° | NA | +2°/−2° |

Figure 5:
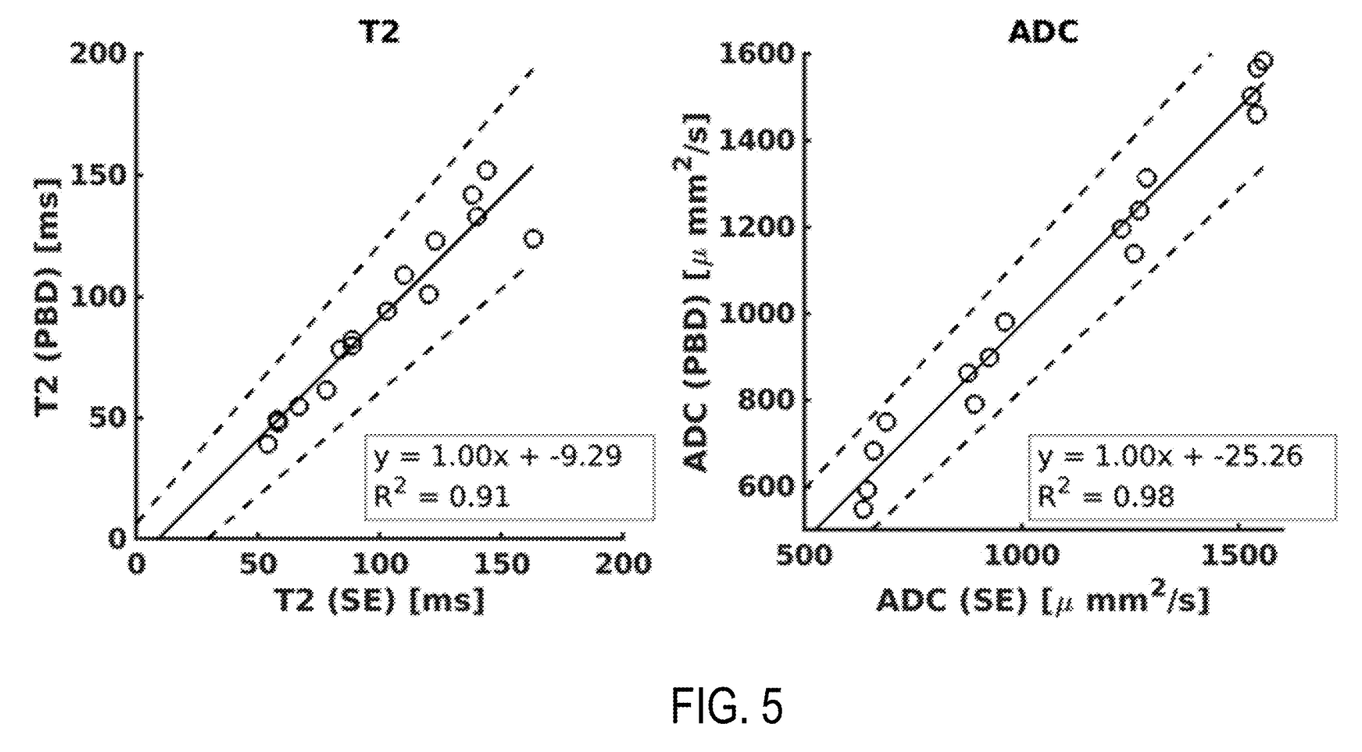
FIG. 5 is a set of graphs of measured T2 and ADC values compared with conventional T2 and ADC mapping.

Referring to FIG. 5, plots of T2 and ADC values, compared with conventional T2 and ADC mapping showed excellent agreement. Thus, the advantages of the systems and methods of the present disclosure are provided without signal disagreement with conventional imaging methods. Thus, the present disclosure provides an RF-phase modulated qualitative diffusion method using a 3D GRE acquisition that overcomes the drawbacks of conventional methods while yielding consistent results. Simulation and phantom studies showed the feasibility of the proposed equations and mapping approach.

Current diffusion imaging techniques require expensive, high performance, gradient hardware necessary to encode diffusion weighting into the signal. The systems and methods provided herein allow one to encode diffusion information using low gradient amplitude compared to conventional method, which substantially reduces the hardware requirements (e.g., gradients) for diffusion imaging.

The above-described systems and methods may be further adapted for various clinical applications. For example, the removal of fat signal can be important for diffusion MRI. Triglycerides have very low diffusion and confounds diffusion measurements. Thus, water-only excitation, is compatible with steady-state acquisitions such as described.

Furthermore, present disclosure recognizes that diffusion acquisitions have, historically, been challenged by motion because the acquisitions are long. Furthermore, longer, multipass acquisitions can be challenged by image registration. However, the systems and methods provided herein can be further adapted to address such challenges. That is, the systems and methods provided herein can use an unbalanced readout gradient, such that phase may be biased by motion. However, this can be addressed as described.

In one non-limiting example, a dual steady-state echo (DESS) pulse sequence may be used for simultaneous fast and three-dimensional acquisition of FID- and echo-signal. Typically, DESS pulse sequences have been used for cartilage imaging to obtain T2-weighted images and T2 mapping. Since DESS needs additional readout gradient moment to acquire the echo-signal, it is sensitive to motion during scan. Especially, severe motion artifacts caused by physiological motion such as pulsation, respiratory and so on, can be seen in case of body imaging. Therefore, a very limited number of studies have used the DESS pulse sequence in body imaging. However, the present disclosure provides systems and methods to reduce motion artifacts that can use DESS acquisitions. In one non-limiting example, an alternating polarity of readout gradients may be used, for example, every TRs, to reduce motion artifacts, as will be described.

The DESS pulse sequence is characterized by two consecutive readout gradients that generate FISP and PSIF signal, denoted as S+ and S−. That is, the above-described acquisitions may be modified to include a FISP echo ($S_+$) followed by PSIF echo ($S_-$). The pulse sequence inverts the polarity of readout gradient pulses to cancel the effect of motion. In this case, the signal phases of odd and even TRs are modulated differently ($S_+^{odd}$, $S_-^{odd}$, $S_+^{even}$ and, $S_-^{even}$) due to an eddy current-induced phase component.

Figure 6:
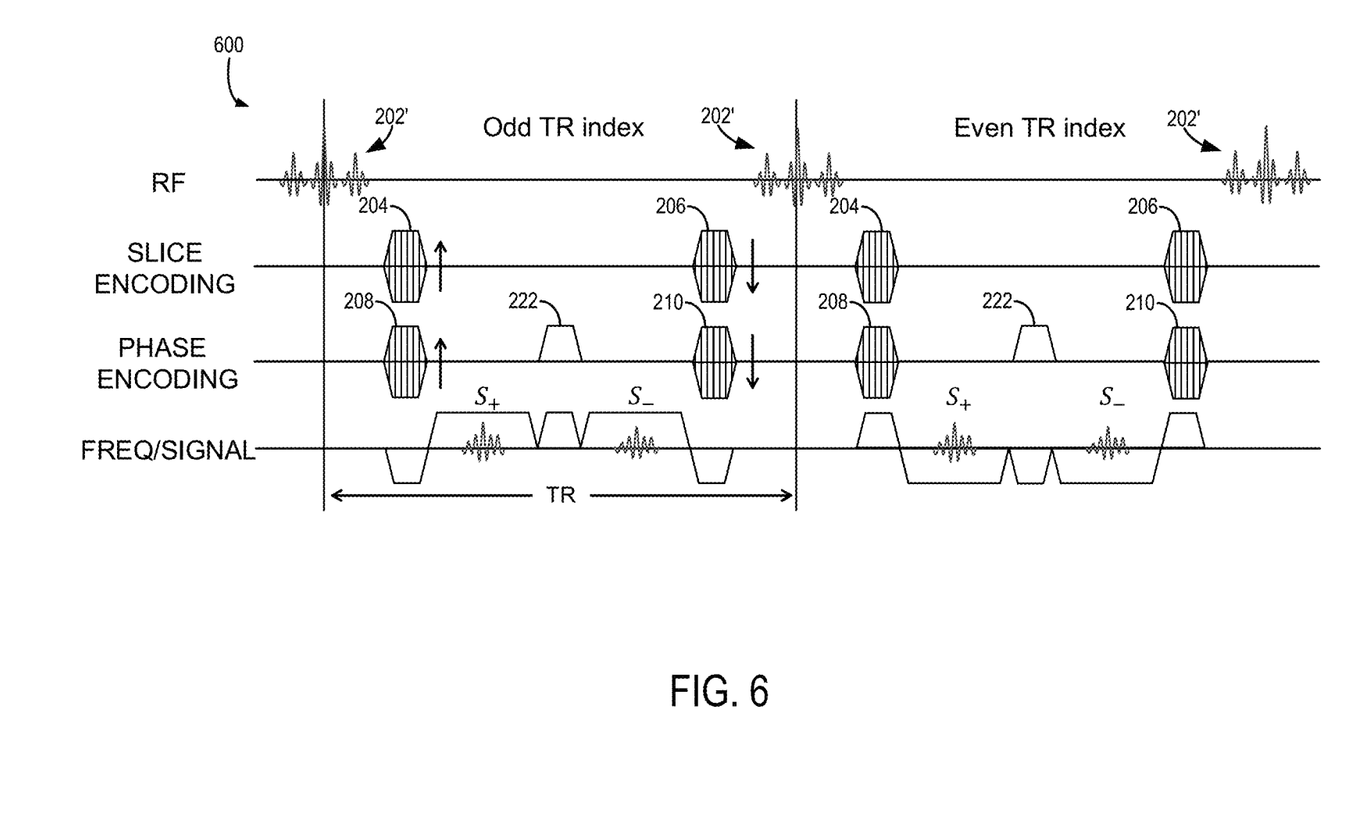
FIG. 6 is a graphic representation of an exemplary pulse sequence for directing the MR system of FIG. 1 in accordance with aspects of the present disclosure related to control against motion artifacts, including diffusion weighted imaging.

Thus, in accordance with the present disclosure a readout alternation (ROA) approach can be introduced to the DESS pulse sequence construct. The ROA approach, in one non-limiting example, can be achieved by inverting polarity of gradient pulses 214 in the readout axis in every TR. In this regard, referring to FIG. 6, a pulse sequence 600 very similar to that described above with respect to FIG. 2 is formed. The RF pulses 202' may be binomial RF pulses. Also, to achieve steady-state, an additional spoiler gradient 222 can be inserted in phase-encoding direction. This is not a traditional DESS pulse sequence because it has a different signal pathway from conventional DESS, which results in a different signal response to T1 and T2.

For the simplicity, the B0-induced phase component can be ignored because it doesn't depend on the gradient pulses. The echoes can be expressed as:

$$S_+^{odd} = S_+ e^{i\delta_1}, \quad \text{Eqn. (40);}$$

$$S_-^{odd} = S_- e^{i\delta_2}, \quad \text{Eqn. (41);}$$

where $\delta_1$ and $\delta_2$ are the eddy current-induced phases for $S_+^{odd}$ and $S_-^{odd}$. When the polarity of the readout gradient is inverted, only the eddy current-induced phase is also inverted. Therefore, the echoes of even TRs can be expressed as:

$$S_+^{even} = S_+ e^{i\delta_1}, \quad \text{Eqn. (42);}$$

$$S_-^{even} = S_- e^{i\delta_2}, \quad \text{Eqn. (43);}$$

Figure 7:
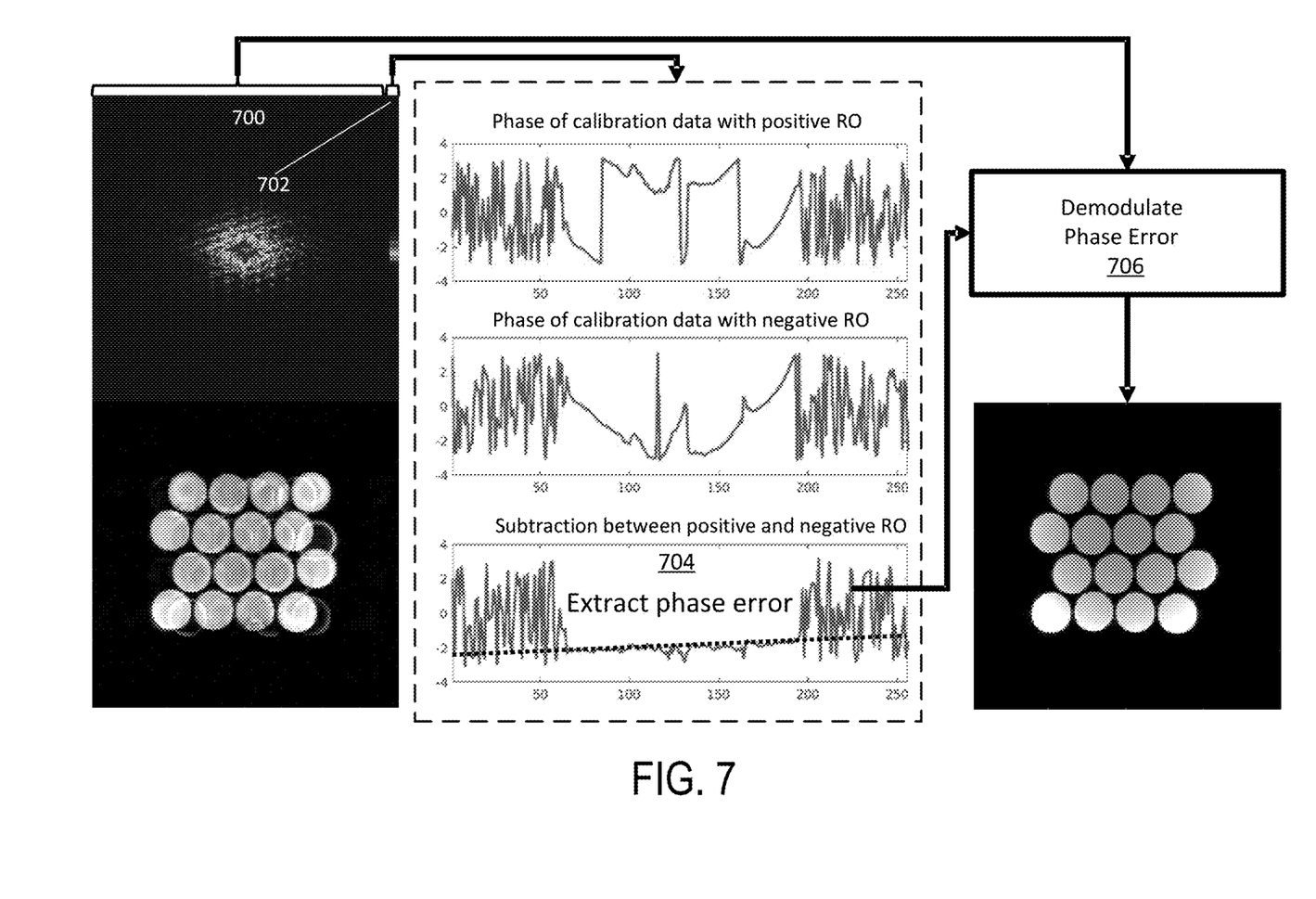
FIG. 7 is a graphic representation of a process for phase correction for acquired MR signals in accordance with the present disclosure.
Figure 8A:
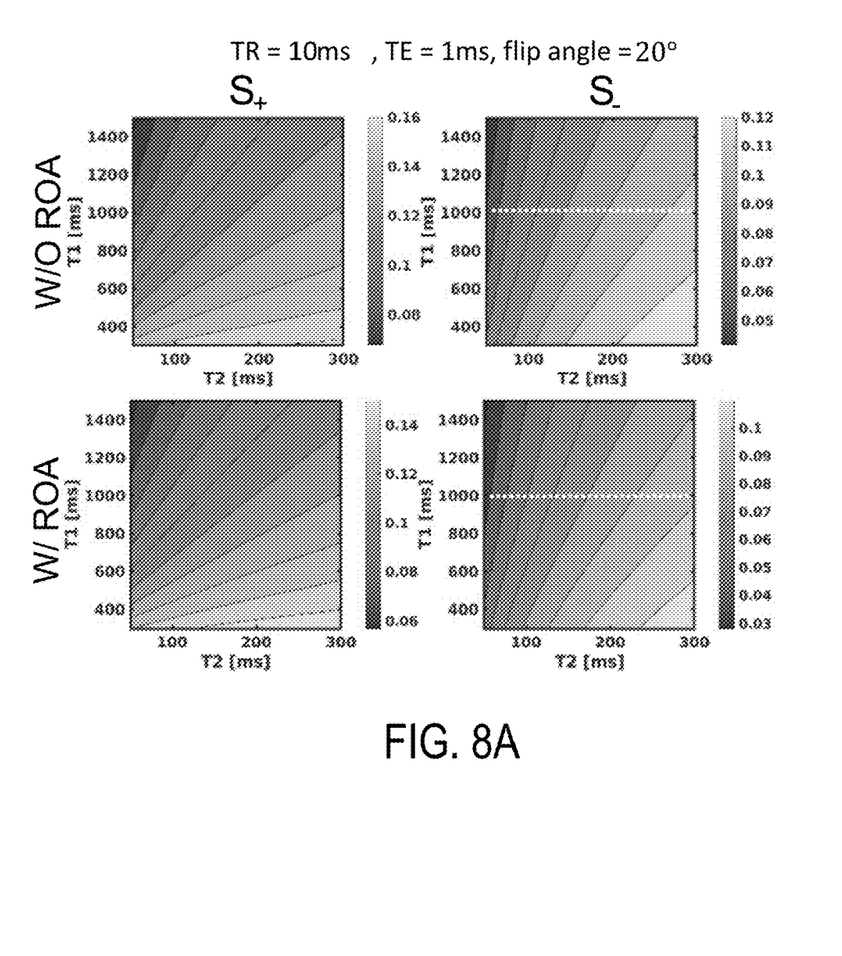
FIG. 8A is a set of graphs of simulated signal intensity responses to T1 and T2 for S+ and S− signals acquired in accordance with the present disclosure.
Figure 8B:
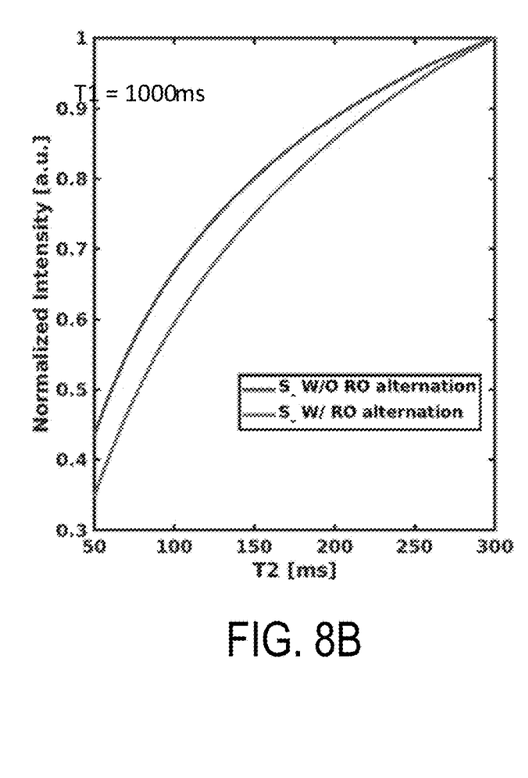
FIG. 8B is a graph of normalized signal intensities of S− with and without ROA at T1=1000 ms, as indicated by the horizontal dotted lines in FIG. 8A.

Since the dominant components of the phase errors induced by the gradient switching are $0^{th}$ and $1^{st}$ components, $\delta_1$ and $\delta_2$ can be expressed as:

$$\delta_1 = a_1 x + b_1, \quad \text{Eqn. (44);}$$

$$\delta_2 = a_2 x + b_2, \quad \text{Eqn. (45);}$$

where a and b are the constant coefficients, and x is the spatial coordinate along the readout gradient. These coefects can be determined by fitting the phase difference between signals with positive and negative readout gradients, as shown in FIG. 7. That is, a main acquisition 700 and a calibration acquisition 702 are performed. The calibration acquisition 200 provides both positive RO and negative RO phase information and enables the extraction of phase error, for example, by using a linear fitting or other fitting 704. Then, the phase errors of $\delta_1$ and $\delta_2$ can be removed by demodulating the phase derived from the equations (44) and (45) determined by the fitting 706. FIG. 8A shows the simulated signal intensity of S+ and S− depending on T1 and T2 for conventional and the proposed DESS. The normalized intensities of S− signals shown in FIG. 8B indicate that ROA gives slightly higher T2 sensitivity.

This process yields data that can be made robust against a variety of potential sources of errors or artifacts. For example, this process can be designed to be robust against or compensate for error such as eddy current-induced phase errors or motion-induced errors, as just two examples.

Phase Correction

Phase correction can be performed as described with respect to FIG. 7 to correct the errors caused by gradient delay. To calculate the phase error, calibration acquisitions without phase-encoding can be performed after the main acquisitions. The phase error can be estimated by obtaining phase subtraction between even and odd numbers of phase-encoding lines. Signals can be demodulated using the estimated phase.

Artifacts Caused by Motion

Signals that suffer from motion and flow artifacts, arise from a phase modulation by motion during readout gradient pulses. Assuming a constant velocity during TR, the phase modulation can be expressed as:

$$\varphi_m = \int_0^\tau G \cdot r(t) dt, \qquad \text{Eqn. (46);}$$

with $$r(t) = vt + r_0 \qquad \text{Eqn. (47);}$$

where G is a linear magnetic field generated by the gradient coil, r is the position of an isochromat, $\tau$ is a time duration spin experience the field, v is the velocity of motion, and $r_0$ is the initial isochromat position. Equations (46) and (47) lead to the following equation which explains the modulated phase error for a specific TR index j:

$$\varphi_m(j) = \frac{1}{2} G \cdot \Delta \cdot v \cdot TR \cdot j^2 + G \cdot \Delta \cdot v \cdot \left(\frac{1}{2} TR - \Delta\right) \cdot j; \qquad \text{Eqn. (48)}$$

where $\Delta$ is the pulse duration. Motion causes additional linear and quadratic phase change in every TR, resulted in artifacts along phase-encoding direction in image domain.

The significance of artifacts can be evaluated by the sidelobe-to-peak ratio (SPR) of the point spread function (PSF) defined as:

$$SPR = \max_{i \ne j} \left| \frac{PSF(i, j)}{PSF(i, i)} \right|, \qquad \text{Eqn. (49);}$$

where i and j are the pixel position of PSF.

To evaluate motion artifacts in S+ and S− signals caused by motion, simulation studies were performed using Bloch equation with phase errors by motions. Slow and small oscillating motions were assumed with frequency of 0 to 5 Hz, and peak-to-peak motion magnitude of 0.1 to 0.5 mm. Sequential and centric orderings for phase-encoding were used. SPRs and signal intensities of S+ and S− for simulated signals were measured.

A liver volunteer was included to demonstrate the feasibility and motion sensitivity of the proposed approach. The acquisition was performed with breath-holding.

Reviewing plots of measured SPRs, the results indicated that S− signal has higher sensitivity to motion, and severe artifacts can be seen in case of sequential ordering acquisitions. Centric encoding and ROA approach suppress the motion artifacts for both S+ and S− signals. Notably, ROA improved signal losses by motion, while centric encoding didn't affect signal intensity. Signal dropped sharply without ROA as the motion magnitude increased. S+ and S− images of the volunteer liver showed that centric encoding improved artifacts compared to sequential encoding. Severe signal losses were observed in the images without ROA. Thus, the results indicated that the approach improves artifacts and signal losses due to motion.

The above-described ROA approach can be used in a variety of setting, for example, including fast T2-weighted imaging in the liver. A small physiological motion during breath-holding may be the source of artifacts. Also, the severe signal losses of S− in the left lobe could be caused by cardiac motion which is also problematic in the diffusion-weighted imaging. The volunteer study demonstrated that imaging using centric encoding and ROA improves both artifacts and signal losses.

Notably, the above-described ROA technique yields slightly lower signal-to-noise ratio (SNR) compared to the conventional DESS. However, any SNR loss can be offset by optimizing sequence parameters.

The present invention has been described in terms of one or more preferred embodiments, and it should be appreciated that many equivalents, alternatives, variations, and modifications, aside from those expressly stated, are possible and within the scope of the invention.

The invention claimed is:

1. A magnetic resonance imaging (MRI) system comprising:
    a magnet system configured to generate a static magnetic field ($B_0$) about at least a portion of a subject arranged in the MRI system;
    a plurality of gradient coils configured to apply magnetic gradients to the static magnetic field;
    a radio frequency (RF) system configured to apply an excitation field to the subject and acquire MR image data from the subject;
    a computer system programmed to:
        control the plurality of gradient coils and the RF system to perform a multi-pass, multi-echo or multi-repetition gradient echo pulse sequence that includes a phase increment of an RF pulse of the multi-pass, multi-echo or multi-repetition gradient echo pulse sequence selected to encode diffusion information into a phase of MR signals, wherein the RF pulse is performed at a beginning and an end of each pass or repetition and a polarity of the phase increment is varied between passes or repetitions of the multi-pass or multi-repetition gradient echo pulse;
        control the plurality of gradient coils and the RF system to acquire the MR signals as MR data;
        process the MR data to determine MR signals corresponding to diffusion in the subject when acquiring the MR signals; and
        generate at least one of an image or a map of the subject indicating the diffusion in the subject from the MR data.

2. The MRI system of claim 1, wherein the computer system is further programmed to use one of a signal model, a look-up table, or a machine learning module to determine the MR signals corresponding to the diffusion and generate the at least one of the image or the map indicating the diffusion in the subject.

3. The MRI system of claim 1, wherein the computer system is further programmed to apply motion probing gradient pulses as part of the multi-pass, multi-echo or multi-repetition gradient echo pulse sequence.

4. The MRI system of claim 3, wherein the computer system is further programmed to modulate an amplitude of motion probing gradient pulses.

5. The MRI system of claim 4, wherein the computer system is further programmed to evaluate a relationship between the amplitude of the motion probing gradient pulses, the phase increment, and a diffusion coefficient to determine diffusion in the subject and generate the last one of the image or the map of the subject indicating the diffusion.

6. The MRI system of claim 1, wherein the phase increment is formed using a quadratic increase of transmitting phase to encode T2 information into phase of the MR signals.

7. The MRI system of claim 1, wherein the computer system is further programmed to control the plurality of gradient coils to apply positive readout gradients and negative gradients and the computer system is programmed to analyze MR signals acquired during the positive readout gradients and negative gradients to identify phase errors induced by eddy current.

8. The MRI system of claim 1, wherein the computer system is further programmed to control the plurality of gradient coils and the RF system to perform multiple repetitions of the multi-pass, multi-echo or multi-repetition gradient echo pulse sequence with differing phase increments and wherein the computer system is further programmed to identify linear or quadratic phase change between the multiple repetitions corresponding to artifacts along a phase-encoding direction in the MR data.

9. The MRI system of claim 8, wherein the computer system is further programmed to evaluate artifacts in the at least one of the image or the map of the subject by evaluating a sidelobe-to-peak ratio (SPR) of a point spread function (PSF).

10. A magnetic resonance imaging (MRI) system comprising:
a magnet system configured to generate a static magnetic field ($B_0$) about at least a portion of a subject arranged in the MRI system;
a plurality of gradient coils configured to apply magnetic gradients to the static magnetic field;
a radio frequency (RF) system configured to apply an excitation field to the subject and acquire MR image data from the subject;
a computer system programmed to:
control the plurality of gradient coils and the RF system to perform a gradient echo pulse sequence that includes a phase increment of an RF pulse of the gradient echo pulse sequence selected to encode diffusion information into a phase of MR signals;
control the plurality of gradient coils and the RF system to acquire the MR signals as MR data;
process the MR data to determine MR signals corresponding to diffusion in the subject when acquiring the MR signals; and
generate at least one of an image or a map of the subject indicating the diffusion in the subject from the MR data; and wherein the MR data corresponding to a first of the multiple repetitions includes a fast imaging with steady-state precession (FISP) echo ($S_1^+$) and a second of the multiple repetitions includes a time reversed fast imaging with steady state precession (PSIF) echo ($S_1^-$).

11. The MRI system of claim 10, wherein the computer system is further programmed to subtract MR data corresponding to the $S_1^+$ echo and the $S_1^-$ echo and compare a result of the subtraction to a look up table to determine MR signals corresponding to diffusion in the subject.

12. A method for controlling a magnetic resonance imaging (MRI) system, the method comprising:
performing a multi-pass, multi-echo or multi-repetition gradient echo pulse sequence that includes a phase increment of an RF pulse of the multi-pass, multi-echo or multi-repetition gradient echo pulse sequence selected to encode diffusion information into a phase of MR signals, wherein the RF pulse is performed at a beginning and an end of each pass, multi-echo or repetition and the phase increment is varied between passes or repetitions of the multi-pass, multi-echo or multi-repetition gradient echo pulse;
controlling the plurality of gradient coils and the RF system to acquire the MR signals as MR data;
processing the MR data to determine MR signals corresponding to diffusion in the subject when acquiring the MR signals; and
generating at least one of an image or a map of the subject indicating the diffusion in the subject from the MR data.

13. The method of claim 12, further comprising using one of a signal model, a look-up table, or a machine learning module to determine the MR signals corresponding to the diffusion and generate the at least one of the image or the map indicating the diffusion in the subject.

14. The method of claim 12, further comprising applying motion probing gradient pulses as part of the multi-pass, multi-echo or multi-repetition gradient echo pulse sequence.

15. The method of claim 14, further comprising modulating an amplitude of motion probing gradient pulses.

16. The method of claim 15, further comprising evaluating a relationship between the amplitude of the motion probing gradient pulses, the phase increment, and a diffusion coefficient to determine diffusion in the subject and generate the last one of the image or the map of the subject indicating the diffusion.

17. The method of claim 12, further comprising performing multiple repetitions of the multi-pass, multi-echo or multi-repetition gradient echo pulse sequence with differing phase increments.

18. The method of claim 12, wherein the phase increment is formed using a quadratic increase of transmitting phase to encode T2 information into phase of the MR signals.

19. The method of claim 12, further comprising applying positive readout gradients and negative gradients and analyzing MR signals acquired during the positive readout gradients and negative gradients to identify phase errors induced by eddy current.

20. The method of claim 12, further comprising performing multiple repetitions of the multi-pass, multi-echo or multi-repetition gradient echo pulse sequence with differing phase increments and identifying linear or quadratic phase change between the multiple repetitions corresponding to artifacts along a phase-encoding direction in the MR data.

21. A method for controlling a magnetic resonance imaging (MRI) system, the method comprising:

performing a gradient echo pulse sequence that includes a phase increment of an RF pulse of the gradient echo pulse sequence selected to encode diffusion information into a phase of MR signals;

controlling the plurality of gradient coils and the RF system to acquire the MR signals as MR data;

processing the MR data to determine MR signals corresponding to diffusion in the subject when acquiring the MR signals; and generating at least one of an image or a map of the subject indicating the diffusion in the subject from the MR data; and wherein the MR data corresponding to a first of the multiple repetitions includes a fast imaging with steady-state precession (FISP) echo ($S_1^+$) and a second of the multiple repetitions includes a time reversed fast imaging with steady state precession (PSIF) echo ($S_1^-$).

22. The method of claim 21, further comprising subtracting MR data corresponding to the $S_1^+$ echo and the $S_1^-$ echo and comparing a result of the subtraction to a look up table to determine MR signals corresponding to diffusion in the subject.

23. A method for controlling a magnetic resonance imaging (MRI) system, the method comprising:

performing a gradient echo pulse sequence that includes a phase increment of an RF pulse of the gradient echo pulse sequence selected to encode diffusion information into a phase of MR signals;

controlling the plurality of gradient coils and the RF system to acquire the MR signals as MR data;

processing the MR data to determine MR signals corresponding to diffusion in the subject when acquiring the MR signals; and generating at least one of an image or a map of the subject indicating the diffusion in the subject from the MR data;

performing multiple repetitions of the gradient echo pulse sequence with differing phase increments and identifying linear or quadratic phase change between the multiple repetitions corresponding to artifacts along a phase-encoding direction in the MR data; and further comprising evaluating artifacts in the at least one of the image or the map of the subject by evaluating a sidelobe-to-peak ratio (SPR) of a point spread function (PSF).

* * * * *

UNITED STATES PATENT AND TRADEMARK OFFICE
CERTIFICATE OF CORRECTION

PATENT NO. : 11,874,358 B2
APPLICATION NO. : 17/695409
DATED : March 15, 2022
INVENTOR(S) : Daiki Tamada et al.

It is certified that error appears in the above-identified patent and that said Letters Patent is hereby corrected as shown below:

In the Specification

Column 1, Line 6, "Sponsered" should be --Sponsored--.

Column 1, Line 32, "Gy$_y$" should be --G$_y$--.

Column 4, Line 5, "$F_n = \sum_{l=-\infty}^{\infty} f_l(n)e^{j\theta l(n)}e^{jl\varphi}$" should be --$F_n = \sum_{l=-\infty}^{\infty} f_l(n)e^{j\theta l(n)}e^{jl\varphi}$--.

Column 4, Line 6, "$H_n = \sum_{l=-\infty}^{\infty} h_l(n)e^{j\theta l(n)}e^{jl\varphi}$" should be --$H_n = \sum_{l=-\infty}^{\infty} h_l(n)e^{j\theta l(n)}e^{jl\varphi}$--.

Column 6, Line 9, "$\sum_{l=-\infty}^{\infty} f_l(n)e^{j\theta l(n)}e^{jl\phi} = \sum_{l=-\infty}^{\infty} X(l)f_l(n-1)e^{j\theta l(n-1)}e^{j(l+1)\phi}$," should be --$\sum_{l=-\infty}^{\infty} f_l(n)e^{j\theta l(n)}e^{jl\phi} = \sum_{l=-\infty}^{\infty} X(l)f_l(n-1)e^{j\theta l(n-1)}e^{j(l+1)\phi}$--.

Column 6, Line 10, "$\sum_{l=-\infty}^{\infty} f^*_l(n)e^{j\theta l(n)}e^{jl\phi} = \sum_{l=-\infty}^{\infty} X(l)f^*_{-l}(n-1)e^{j\theta_{-l}(n-1)}e^{j(-l+1)\phi}$," should be --$\sum_{l=-\infty}^{\infty} f^*_{-l}(n)e^{j\theta l(n)}e^{jl\phi} = \sum_{l=-\infty}^{\infty} X(-l)f^*_{-l}(n-1)e^{j\theta_{-l}(n-1)}e^{j(-l+1)\phi}$--.

Column 11, Line 23, "10" should be --110--.

Column 16, Line 24, "S$_+^{odd}$, S$_-^{odd}$, S$_+^{even}$, S$_-^{even}$" should be --$S_+^{odd}, S_-^{odd}, S_+^{even}, S_-^{even}$--.

Column 16, Line 42, "S$_+^{odd}$=S+e$^{i\delta 1}$" should be --$S_+^{odd} = S_+ e^{i\delta_1}$--.

Signed and Sealed this
Seventeenth Day of September, 2024

Katherine Kelly Vidal
*Director of the United States Patent and Trademark Office*

CERTIFICATE OF CORRECTION (continued)
U.S. Pat. No. 11,874,358 B2

Column 16, Line 44, "S_$^{odd}$=S_e$^{iδ2}$" should be -- $S_-^{odd} = S_- e^{iδ_2}$ --.

Column 16, Line 46, "S$_+^{odd}$, and S_$^{odd}$" should be -- $S_+^{odd}$, and $S_-^{odd}$ --.

Column 16, Line 51, "S$_+^{even}$=S+e$^{iδ1}$" should be -- $S_+^{even} = S_+ e^{iδ_1}$ --.

Column 16, Line 52, "S_$^{even}$=S_e$^{iδ2}$" should be -- $S_-^{even} = S_- e^{iδ_1}$ --.

Column 17, Line 29, "φm∫$_0^τ$G·r(t)dt" should be -- $\varphi_m = \int_0^\tau G\, r(t) dt$ --.